United States Patent [19]
Jones et al.

[11] Patent Number: 5,208,067
[45] Date of Patent: May 4, 1993

[54] SURFACE MODIFICATION OF ORGANIC MATERIALS TO IMPROVE ADHESION

[75] Inventors: Carol R. Jones, Binghamton; Robin A. Susko, Owego, both of N.Y.

[73] Assignee: International Business Machines Corporation, Armonk, N.Y.

[21] Appl. No.: 700,833

[22] Filed: May 16, 1991

Related U.S. Application Data

[62] Division of Ser. No. 449,184, Dec. 13, 1989, Pat. No. 5,039,569, which is a division of Ser. No. 93,923, Sep. 8, 1987, Pat. No. 4,908,094, which is a division of Ser. No. 851,856, Apr. 14, 1986, Pat. No. 4,715,941.

[51] Int. Cl.$^5$ .............................. H01L 21/00
[52] U.S. Cl. ........................ 427/96; 427/123; 427/307; 427/322; 156/657; 156/653; 156/668; 156/643; 156/646
[58] Field of Search .......... 427/98, 307, 322, 123, 427/96; 156/668, 646, 657, 651, 653, 662, 643

[56] References Cited

U.S. PATENT DOCUMENTS

| | | | |
|---|---|---|---|
| 4,137,365 | 1/1979 | Wydeven et al. | 427/40 |
| 4,493,855 | 1/1985 | Sachdev et al. | 427/96 |
| 4,599,243 | 7/1986 | Sachdev et al. | 427/38 |

OTHER PUBLICATIONS

"Plasma Polymer Surface Adhession Modification Method"; Nguyen et al., IBM Tech. Disclosure Bulletin; vol. 27, No. 6, Nov. 1984, pp. 3273-3274.
"Polymer Interlayer Adhesion Enhancements Through Plasma Surface Modification"; Wheater et al., E.C.S. Meeting; Oct. 1983.

*Primary Examiner*—Brian E. Hearn
*Assistant Examiner*—George Goudreau
*Attorney, Agent, or Firm*—Judith Olsen; Richard M. Goldman

[57] ABSTRACT

A silicon modified organic surface is roughened by treatment with an oxygen containing plasma. If necessary the organic surface may be silicon-modified by treatment with a silicon containing material prior to plasma treatment. The roughened organic surface provides improved adhesion to other organic surfaces and to deposited metals. Improvements in methods for laminating organic surfaces and for depositing metals on organic surfaces which achieve improved adhesion are disclosed. Structures comprising laminated organic layers or metal deposited on organic surfaces which provide improved adhesion between the organic layers or between the metal and the organic-surface are also disclosed.

14 Claims, 1 Drawing Sheet

SURFACE MODIFICATION OF ORGANIC MATERIALS TO IMPROVE ADHESION

This is a divisional of patent application Ser. No. 07/449,184 which issued 12/13/89 as U.S. Pat. No. 5,039,569; which is a divisional of patent application Ser. No. 07/093,923 which issued 9/8/87 as U.S. Pat. No. 4,908,094: which is a divisional of patent application Ser. No. 07/851,856 which issued 4/14/86 as U.S. Pat. No. 4,715,941.

FIELD OF THE INVENTION

This invention relates to the treatment of silicon-modified organic surfaces with an oxygen containing plasma in order to achieve roughening and improved adhesion to other organic surfaces and to metals coated thereon.

BACKGROUND OF THE INVENTION

In industrial applications it is often desirable to uniformly roughen organic surfaces on a microscopic level.

Such roughening is especially desirable in the computer industry in the manufacture of first and second level packages for the mounting of information processing devices known as chips.

In such manufacture it is often desirable to attach copper to an organic surface so that the copper does not easily become detached. It is known that metals have improved adhesion to roughened organic surfaces. Various industrial processes which involve uniform roughening of organic surfaces have been developed to improve the attachment of the copper. Most such processes work well but are accompanied by certain problems and disadvantages which are sought to be overcome.

In one process of the prior art a layer of sacrificial copper is laminated onto the organic surface and then stripped away in order to modify the topography of the organic surface so that it will be less smooth and more accepting to the electroless deposition of copper from a plating bath. This process works well and is widely used. However, it has the disadvantage that it consumes a great deal of expensive copper.

In another prior art process which also enjoys wide use, a thin layer of chrome is deposited on an organic surface prior to deposition of copper. It is not completely understood how this process works to improve copper adhesion to the organic surface, but it is believed that the chrome may react chemically or become electrostatically attached to the organic surface. Chrome is an expensive metal, and its use in improving the adhesion of copper to organic materials adds a step to the packaging process. The higher electrical resistivity of chrome may make its use undesirable for many applications. Chrome is normally applied by sputtering or evaporation techniques, which are usually convenient only with structures smaller than printed circuit boards.

Sandblasting is another method used in the prior art to roughen organic surfaces for subsequent deposition of a metal or for subsequent lamination to a second organic material. It is known that roughening the surface of at least one of the layers in an organic laminate structure will improve the adhesion between the roughened surface and the adjacent layer. Sandblasting can be effective for uniformly roughening organic surfaces; however, it is sometimes destructive to the fine features of the surface to be treated and not penetrate deeply into crevices or holes.

It is often necessary in the manufacture of first and second level packages for the computer industry to plate the walls of holes or interconnections, commonly referred to as "through holes" or "vias" which have been drilled or etched in an organic structure, such as a printed circuit board. Drilling smears the organic material from which the board is made and causes it to cover electrical interplanes such as signal, power or ground planes which are desirably left exposed for subsequent connection by the plating of a metal layer on the walls of the through hole. Desmearing of the vias or through holes is necessary. In the past desmearing has been achieved by sandblasting, chemical treatment and plasma treatment, either alone or in various combinations. However it is difficult to achieve effective desmearing with sandblasting, which is especially ineffective in high aspect ratio through holes. Liquid desmearing of the drilled hole walls with materials such as hydrochloric acid and methyl carbitol or by, chromic acid, sulfuric acid and n-methyl pyrolidinone is effective. The use of such chemicals leaves the walls desmeared and sufficiently roughened for subsequent electroless plating of metals. However, these liquids have the disadvantages that they sometimes etch away too much of the organic material, undercutting the interplanes and that they are sometimes undesirable from worker safety and environmental standpoints and presents potential reliability problems with respect to corrosion and migration of the applied metal.

The desmearing of drilled through holes by plasma treatment has been tried and found to be effective. However, plasma desmearing leaves a very smooth surface on the organic material in the walls of the hole, making subsequent electroless deposition of metals very difficult. Roughening of the surface prior to such deposition is necessary.

A paper by R. H. Wheater et al describing a process for roughening the surface of an epoxy resin was published in October of 1983 as a part of the minutes of a May, 1983, plasma symposium of the Electrochemical Society. In that process the epoxy resin was filled with silicon dioxide particles and subjected to an $O_2/CF_4$ plasma. The silicon dioxide particles in the resin surface were not effected by the oxygen containing plasma while the epoxy resin therebetween was removed, resulting in a roughening of the surface. Improved adhesion to untreated epoxy and to copper was noted. However, the silicon dioxide particles in the epoxy gave the bulk of the filled epoxy properties of strength, processability and rheology which are undesirable, especially in the manufacture of first level electronic packages such as substrates and semiconductors.

SUMMARY OF THE INVENTION

It is an object of this invention to overcome the disadvantages of the prior art.

It is another object of this invention to uniformly roughen substantially organic surfaces.

It is also an object of this invention to improve the adhesion between a substantially organic surface and a metal layer coated onto the surface.

It is a further object of this invention to improve the adhesion between laminated surfaces which are substantially organic.

It is yet another object of this invention to provide layered structures having improved adhesion between the layers.

These and other objects are accomplished by the present invention which, in one aspect, relates to a method for roughening a silicon-modified organic surface, said method comprising subjecting the surface to an oxygen containing plasma.

In another aspect the present invention relates to a method for modifying a substantially organic surface comprising the sequential steps of: (a) treating the organic surface with a silicon containing material; and (b) subjecting the treated surface to an oxygen containing plasma.

In yet another aspect the present invention relates to an improvement in the method for a laminating silicon-modified surface to an organic surface, said method comprising subjecting the surfaces to pressure contact, the improvement comprising subjecting the silicon-modified surface to an oxygen containing plasma prior to pressure contact, whereby adhesion between the silicon-modified surface and the organic surface is improved.

In still another aspect the present invention relates to an improvement in the method for laminating a first organic surface to a second organic surface, which method comprises contacting said first and second surfaces under pressure, the improvement comprising the sequential steps of: (a) treating at least one of said first or second organic surfaces with a silicon containing material; and (b) subjecting whereby adhesion between said first and second surfaces is improved.

In a further aspect the present invention relates to an improvement in the method for coating an organic surface with a metal, said method comprising depositing a metal onto the organic surface, the improvement comprising, prior to deposition, (a) treating the organic surface with a silicon containing material; and (b) subjecting the treated surface to an oxygen containing plasma, whereby adhesion between the organic surface and the deposited metal is improved.

In still another aspect the present invention relates to an improvement in the method for coating a silicon-modified organic surface with metal comprising electrolessly depositing a layer of metal on said organic surface from a metal containing bath, the improvement comprising, prior to electroless deposition of the metal, subjecting the silicon-modified surface to an oxygen containing plasma, whereby adhesion between the silicon-modified surface and the electrolessly deposited metal is improved.

The invention also contemplates layered structures of organic materials or metals coated onto organic layers wherein the organic layer has been processed by the inventive method described herein or wherein the layer comprises a silicon-modified organic material and has been processed by the inventive method.

BRIEF DESCRIPTION OF THE DRAWINGS

The invention will be described with reference to the accompanying drawings in which.

DETAILED DESCRIPTION

Figure 1:
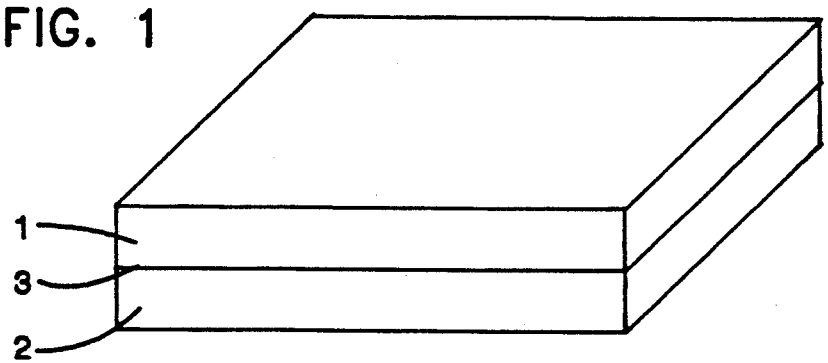
FIG. 1 shows a laminate of organic materials having improved adhesion between the layers.

This invention is based on the discovery that a surface which has been modified with silicon will uniformly roughen when subjected to an oxygen containing plasma, providing improved adhesion to organic surfaces and to coated metals.

For purposes of the present invention, a useful organic surface is one which has sufficient organic content to be effected by the operation of an oxygen containing plasma. Resins which are typically used in the fabrication of first and second level packages in the computer industry are examples of such resins, although many other useful resins will be readily apparent to those of ordinary skill in resin technologies. Examples of such useful resins are bisphenol A/epichlorohydrin resins, epoxy resins, novalac resins, and polyimides. The resins may be modified to have special properties. For example, they may be silylated or contain photoinitiators.

Resins which do not comprise silylated polymers must be surface modified with silicon as a first step in the process of the present invention. Such modification can be accomplished by exposing the surface to a silicon containing liquid vapor so that at least some silicon is deposited on attached to or absorbed into the surface. Useful methods for applying a silicon containing material to the surface are by spin coating, dip coating and vapor contact, all of which are well known techniques.

It has been found that a silicon-modified organic surface which presents substantially any silicon to an excited, oxygen containing gas will be roughened. However, when the silicon content of the surface is below about 5 atomic weight percent, the roughening is sometimes subtle or irregular. Better results are obtained when the silicon content of the organic surface is greater than about 5 atomic weight percent. additional improvement in roughening uniformity or depth occurs when the silicon content of a surface is greater than about 25 atomic weight percent. It is thus preferred that the organic surface be treated with a silicon containing material such that the surface achieves a silicon content of from about 5 to about 25 atomic weight percent.

Some organic resins which may be roughened by the inventive process are made from polymers which have silicon containing moieties. As with the resins which are surface treated, the resins made from silicon containing polymers may be best roughened if they present from about 5 to about 25 atomic weight percent silicon to the excited, oxygen containing gas, although the presentation of substantially any silicon will result in some roughening.

The silicon-modified surface is subjected to an oxygen containing gas in an excited state, either in plasma mode or reactive ion etch (RIE) mode. Such excited gases are often referred to as "plasmas" whether in plasma mode or RIE mode and the term "plasma" as used elsewhere herein is intended to encompass such a notion. The specific pressure gas flow rate and power used to treat the surface is not critical to the operation of the process. The oxygen content of the gas, however, is important. It has been found that an all-oxygen plasma will function in the present invention, although roughening occurs slowly. It has also been found that roughening does not occur if the oxygen content is below about 30 mole %. (At normal plasma generator gas pressures mole % and volume % are substantially the same values.)

The plasma may contain other gases besides oxygen. Typically the other gas is a fluorine entity such as $CF_4$, $C_2F_6$, $CF_3Cl$, $SF_6$, $CCl_2F_2$ and $NF_3$. These fluorine entities are most often present in the plasma of the present invention in amounts ranging from about 2% by mole to about 70% by mole. It has been found that the speed of the surface roughening is accelerated when as little as 2% by mole of $CF_4$ is present in the plasma and that the plasma begins to etch away silicon entities from the surface when the $CF_4$ concentration rises much above about 70% by mole. The best speed of operation occurs at a preferred fluorine gas concentration in the plasma of about 30% by mole.

$CF_4$ is the preferred fluorine gas because of its availability, ease of handing and chemical compatibility with most organic substrates and metals which may subsequently be deposited on the substrates.

The operation of the invention is not entirely understood. It is believed that the oxygen containing plasma converts the silicon entities on the resin surface to silicon dioxide while etching away the organic material between the silicon entities.

In an additional subsequent step the silicon dioxide material on the plasma-treated surface may be removed by subjecting the surface to an excited gas which contains over 70% by mole of a fluorine entity such as $CF_4$, resulting in a roughened organic surface which does contain silicon material.

In the lamination of organic surfaces by any of the already well known processes such as electroless deposition (which may or may not be followed by electrolytic deposition), sputtering or evaporation, the present invention is useful to improve the adhesion between the laminated surfaces. The adhesion between laminated organic surfaces has been found to be improved about five times after one of the organic surfaces has been subjected to the process of the present invention.

In the coating of metals onto organic surfaces by any of the already well known processes such as electroless deposition (which may or may not be followed by electrolytic deposition), sputtering or evaporation, the present invention is useful to improve the adhesion between the coated metal and the organic substrate. An adhesion improvement of more than three fold has been observed when the organic substrate is treated with the process of the present invention prior to metal coating.

Referring more specifically to FIG. 1, there is shown in cross sectional perspective a structure comprising organic members 1 and 2 in laminar contact at interface 3. Organic members 1 and 2 are made from useful organic materials as described above. At least one of members 1 and 2 has its interfacial surface treated according to the process of the present invention.

If organic member 1 is a silicon-modified material, such as a silylated bisphenol A/epichlorohydrin resin, the surface of member 1 which is to be in laminar contact with member 2 is subjected to an oxygen containing plasma, as is described above.

After such treatment, members 1 and 2 are laminated under pressure to form a structure as shown in FIG. 1 having improved adhesion between said members 1 and 2 at interface 3.

If organic member 1 is not already a silicon-modified organic material, it is surface treated with a silicon material so that its surface will present silicon entities to an oxygen containing plasma during roughening, as is described above. After silicon treatment and treatment by an oxygen containing plasma, members 1 and 2 are laminated under pressure to form a structure as shown in FIG. 1 having improved adhesion between said members at interface 3.

The structure of FIG. 1 will have many uses in industrial applications. It has been found to be especially useful in the manufacture of packages for information processing devices where laminates of organic surfaces are employed and where adhesion between the layers of such laminates is important.

Figure 2:
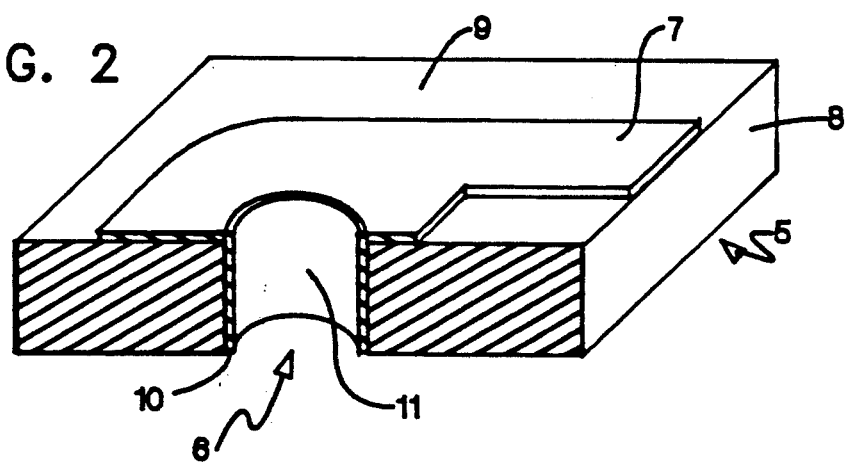
FIG. 2 shows a metal coated onto an organic substrate and having improved adhesion thereto.

Referring more specifically to FIG. 2 there is shown in cross sectional perspective a portion of printed circuit board 5 containing plated through hole 6 and printed circuit line 7. Organic substrate 8 which supports printed circuit line 7 and plated through hole 6 has been treated on surface 9 which supports printed circuit line 7 and surface 10 which supports plating 11 in plated through hole 6 by the process of the present invention as described above in order to improve the adhesion between metal printed circuit line 7 and metal plating 11 and organic substrate 8.

As in connection with member 1 of FIG. 1, if organic substrate 8 is made from a silylated organic material, its surface is subjected to an oxygen containing plasma prior to application of plating 11 and printed circuit line 7. However, if organic substrate 8 is not already silylated, it is surface treated with a silicon containing material prior to treatment by the plasma.

The invention is illuminated and illustrated in its various aspects by the following examples, which are not intended to be limiting.

EXAMPLE 1

A 15% by weight solution of a high molecular weight bisphenol A/epichlorohydrin (n=100) resin having an average of one hydroxyl per repeating unit, which is available from Union Carbide under the trade name PKHH, was mixed with a dioxane solvent and spin-coated onto two glass slides. The coated slides were heated for 5 minutes at 100° C. to insure solvent elimination.

One of the resin coated slides was then dip coated with hexamethyldisilane (HMDS) by immersion for one minute. Excess HMDS was spun off, after which the resin coated, silane treated slide was heated for 10 minutes at 100° C. to drive off traces of the solvent.

The silane-treated slide and the non-silane-treated slide were placed, sequentially, in a modified Tegal plasma etcher such that half of each slide was exposed to the plasma and half was not. The samples were each plasma etched using 20 standard cubic centimeters per minute (sccm) of oxygen at a power density of 0.43 watts/cm$^2$ for 20 minutes in reactive ion etch (RIE) mode.

After etching the plasma-treated and non-plasma-treated portions of each slide was examined with a profilometer and with a scanning electron microscope. The plasma-treated portion of the silane-treated slide was rougher than the plasma-treated portion of the non-silane-treated slide and also rougher than the non-plasma-treated portions of both slides. Profilometry indicated an Ra of 40 micro inches for the non-silane treated surface and an Ra of 114 micro inches for the silane-treated surface after plasma treatment.

The roughness appeared to be substantially uniform. It was best viewed with the scanning electron microscope at an angle of 60°, although roughness could also be observed at an observation angle of 15°.

EXAMPLE 2

The procedure of Example 1 was repeated using a diglyme solvent and a tetrahydrofuran solvent with no noticeable variation in results.

EXAMPLE 3

A dioxane solution of 4.5 % by weight of a silylated high molecular weight bisphenol A/epichlorohydrin (n=100) resin which has been silylated by the substitution of silanes at hydroxyl sites prepared and spin-coated onto a glass slide. The slide was heated briefly to remove any traces of solvent.

The slide was subjected to plasma treatment and subsequent inspection in accordance with the procedure of Example 1. Uniform surface roughening in the plasma-treated areas of the slide was observed.

EXAMPLE 4

A resin formulation was prepared by mixing eight parts DER 667, a diglycidyl ether of bisphenol A epoxy resin (n=10–13) commercially available from Dow Chemical, two parts DER 332 a diglycidyl ether of bisphenol A epoxy resin (n=0), commercially available from Dow Chemical, one part 4-aminophenyl sulphone, in 35 parts dioxane solvent and 22 parts diglyme solvent.

The resin formulation was spin-coated onto two glass slides and cured for three hours at 200° C. to a $T_g$ of 120° C. and a condition of being impervious to organic solvents.

One of the two slides was dip-coated in HDMS and dried according to the procedure of Example 1. Both slides were exposed to $O_2$ plasma and were subsequently inspected according to the procedure of Example 1.

Significant uniform roughening of the plasma-treated silane-treated surface was observed when compared with the other surfaces.

EXAMPLE 5

A hydroxy-functional polyimide was diluted by a factor of four with diglyme and spin-coated onto two glass slides prior to two-stage curing at 130° C. for 30 minutes followed by 275° C. for 30 minutes.

One of the slides was dip-coated with HMDS and dried according to the procedure of Example 1. Both slides were exposed to $O_2$ plasma and were subsequently inspected according to the procedure of Example 1.

Significant uniform roughening of the plasma-treated silane-treated surface was observed when compared with the other surfaces

EXAMPLE 6

A standard positive working novolac resin-based photoresist commercially available from Shipley Co. under the trade name AZ1350J was spin coated onto three glass slides and cured for 30 minutes at 80° C.

One of the slides was subjected to a vapor atmosphere of a photosensitive organosilicon complex (PSK) having the general formula $C_6H_5(CO)Si(CH_3)_3$ at a temperature of 25° C.

A second of the slides was dip coated in PSK for 1 minute and heated for 10 minutes at 100° C. to insure drying of the PSK.

All three slides were subjected to flood exposure to actinic radiation followed by $O_2$ plasma treatment and subsequent inspection for roughness according to the procedure of Example I.

Significant roughening of the plasma-treated portions of both the vapor-treated slide and the dip-coated slide were observed.

EXAMPLE 7

A sample of silylated bisphenol A/epichlorohydrin resin was prepared as in Example 3 except that the resin mixture was cured onto a 2-inch × 12-inch strip of copper (1.7 mil) sheet. The entire strip of cured resin was subjected to a plasma for 5.3 minutes in a gas composition of 62% $O_2$ and 38% $CF_4$ at a power density of about 0.05 watts/cm² and a pressure of 250 mT after which substantially uniform surface roughness was observed.

The strip was then laminated under pressure to a similarly dimensioned cured epoxy resin strip with a slip sheet of Mylar placed between the strips at one end to facilitate separation in subsequent testing. Pressure was applied at 500 lb/in² at a temperature of 175° C. for 80 minutes, followed by 35 minutes cooling. During lamination a vacuum of 30 lb/in² was pulled on the structure.

The laminate was subjected to a "wagon wheel" pull apart test in which each layer of the laminate was attached to one of two wheels which were arranged to rotate in substantial contact and in opposite directions. The laminate was drawn through the nip between the wheels and was pulled apart as it exited the nip. Tension measuring devices connected to the wheels, such as Instron gauges, measured the force at which the laminate was separated at the nip. The force required to separate the laminate was greater than 10.5 lbs./in.

EXAMPLE 8

A bisphenol A/epichlorohydrin resin was prepared and treated with HDMS by dip coating as described in Example 1 and tested according to the procedure of Example 7 with substantially similar results.

EXAMPLE 9

A novalac resin was prepared and treated with silane vapor as in Example 6 prior to testing according to the procedure of Example 7 with substantially similar results.

EXAMPLE 10

A laminate was prepared and tested as in Example 9 except that the resin layer was not subjected to plasma treatment before lamination. The force required to separate the laminate was about 1.25 lbs./in.

EXAMPLE 11

A laminate was prepared and tested as in Example 10 except that the resin layer was baked to remove volatiles before lamination. The force required to separate the laminate was about 2 lbs./in.

EXAMPLE 12

Silicon containing organic resins were prepared by reacting hydroxyfunctional epoxys and hydroxyfunctional novalacs with various amounts of silylating reagents in order to produce a series of such resins having concentrations of silicon of about 0.5, 1, 5, 10, 15, 20, 25 and 40 atomic weight percent. Calculated atomic weight percents were confirmed by infrared spectroscopy. The resins were coated onto glass slides by spin coating and drying sufficiently to drive off traces of solvents.

The coated slides were inspected for surface smoothness and then subjected to $O_2$ plasma at a pressure of about 160 mT and an average power of about 0.86 watts/$cm^2$ and a gas flow of about 20 sccm for about 5 minutes. A second inspection was made of the surface of the slides to check for increased roughness.

SEM inspection of the surfaces before and after plasma treatment showed mechanical roughening of the surface of the samples at all concentrations of silicon. Roughening in samples containing less than 5 atomic weight percent silicon was sometimes subtle and roughening in samples containing more than 25 atomic weight percent silicon did not show an increase in degree.

EXAMPLE 13

A first glass cloth containing epoxy substrate was drilled with a pattern of 18 mil diameter holes. Subsequently, the holes were seeded with a Pd/Sn seed and electrolessly plated with copper to a thickness of about 1 mil.

A second such substrate was drilled with a similar pattern of holes. However, after hole clean and before seeding, it was dip coated in HDMS, dried and treated with an $O_2/CF_4$ plasma having a $CF_4$ content of about 2 mole % for about 30 minutes at an average power of about 0.07 watts/$cm^2$. After the plasma treatment, the second substrate was seeded and electrolessly plated in the same manner as the first substrate.

Both substrates were subjected to a Plated Through Hole (PTH) Adhesion Test in which plated through holes were sectioned lengthwise and the metal inner coating was stripped from the backing resin in such a way that the metal was perpendicular to the resin at the point of separation while the force necessary to accomplish the striping is measured by an Instron gauge attached to the metal.

The first substrate required an average force of 76 g./mm to separate the metal coating in the plated through holes from the surrounding resin. The second substrate required an average force of 243 g./mm.

EXAMPLE 14

Resin-coated slides prepared as in Example 12 and having about 10 atomic weight percent silicon on their surfaces were exposed to an oxygen containing plasma and inspected by profilometry and scanning electron microscopy to confirm surface roughening. The roughened surfaces were analyzed by infrared spectroscopy to confirm the presence of silicon entities.

The roughened surfaces were then subjected to an 85% $CF_4$/15% $O_2$ plasma for 30 minutes at a power of about 0.05 watts per $cm^2$ and reinspected for roughness and for silicon content. Average surface roughness was found to remain substantially the same while substantially all traces of silicon had been removed from the surface.

It will be apparent to one of ordinary skill in the resin technology after reading the above examples that the plasma treatment of silicon containing surfaces or of silicon-treated surfaces modifies such surfaces by roughening them, that such a treatment is suitable for use in connection with a wide variety of organic surfaces, that the treatment is effective using either plasma or RIE, and that the treatment improves the adhesion between organic surfaces when performed prior to lamination and between metal and organic surfaces when practiced prior to plating the metal on the organic. It will also be apparent to those of such skill that surfaces can be prepared for plasma treatment by chemically incorporating silicon into the surface to be treated or by exposing the surfaces to silicon containing materials in liquid or vapor form. It will further be apparent to one of such skill that other oxygen containing plasmas will be useful in practicing the present invention and that a variety of structures in addition to those shown in the examples are within the scope of the invention.

The present invention has been disclosed in the above teachings and in the accompanying drawings with sufficient clarity and conciseness to enable one skilled in the art to make and to use the invention, to know the best mode for carrying out the invention and to distinguish it from other inventions and from what is old. Many variations and obvious adaptations of the invention will readily come to mind and these are intended to be contained within the scope of the invention as claimed below.

What is claimed is:

1. In the method for coating a silicon-modified organic surface with metal comprising electrolessly depositing a layer of metal on said organic surface from a metal containing bath, the improvement comprising, prior to electroless deposition of the metal, subjecting the silicon-modified surface to an oxygen containing plasma, whereby adhesion between the silicon-modified surface and the electrolessly deposited metal is improved.

2. The improvement of claim 1 wherein the plasma also contains a fluorine entity selected from the group consisting of $CF_4$, $C_2F_6$, $CF_3Cl$, $SF_6$, $CCl_2F_2$ and $NF_3$ amounts ranging from about 2 to about 70 mole %.

3. The improvement of claim 2 wherein the plasma contains about 30 mole % $CF_4$.

4. The improvement of claim 1 including the subsequent additional step of subjecting the silicon-modified surface to a predominantly fluorine containing plasma for a time sufficient to substantially remove silicon containing molecules from said surface.

5. The improvement of claim 4 wherein the fluorine containing plasma comprises more than about 70 mole % $CF_4$.

6. The improvement of claim 1 wherein said silicon-modified surface comprises an organic polymer having silicon containing moieties.

7. The improvement of claim 1 wherein said silicon-modified surface comprises an organic polymer which has been treated with a silicon containing material.

8. In a method for coating an organic surface with a metal comprising depositing a metal onto the organic surface, the improvement comprising, prior to metal deposition,
   a. treating said organic surface with a liquid silicone containing material, and
   b. subjecting the treated surface to an oxygen containing plasma,
   whereby adhesion between said organic surface and the deposited metal is improved.

9. In a method for coating an organic surface with a metal comprising depositing a metal onto the organic surface, the improvement comprising, prior to metal deposition,
   a. treating said organic surface with a hexamethyl disilane liquid, and
   b. subjecting the treated surface to an oxygen containing plasma, whereby adhesion between said organic surface and the deposited metal is improved.

10. In a method for coating an organic surface with a metal comprising depositing a metal onto the organic surface, the improvement comprising, prior to metal deposition,
   a. treating said organic surface with a silicon containing material, and
   b. subjecting the treated surface to plasma containing a fluorine entity and oxygen, wherein said fluorine containing entity is chosen from the group consisting of $CF_4$, $C_2F_6$, $CF_3CL$, $SF_6$, $CCL_2F_2$, and $NF_3$, and said plasma contains from about 2 to about 70 mole percent of said fluorine containing entity,
   whereby adhesion between said organic surface and the deposited metal is improved.

11. In a method for coating an organic surface with a metal comprising depositing a metal onto the organic surface, the improvement comprising, prior to metal deposition,
   a. treating said organic surface with a silicon containing material, and
   b. subjecting the treated surface to a plasma containing oxygen and about 30 mole percent $CF_4$,
   whereby adhesion between said organic surface and the deposited metal is improved.

12. In a method for coating an organic surface with a metal comprising depositing a metal onto the organic surface, the improvement comprising, prior to metal deposition,
   a. treating said organic surface with a silicon containing material,
   b. subjecting the treated surface to an oxygen containing plasma, and
   c. thereafter subjecting said surface to a predominantly fluorine containing plasma to substantially remove silicon containing molecules from said surface,
   whereby adhesion between said organic surface and the deposited metal is improved.

13. In a method for coating an organic surface with a metal comprising depositing a metal onto the organic surface, the improvement comprising, prior to metal deposition,
   a. treating said organic surface wit a silicon containing material,
   b. subjecting the treated surface to an oxygen containing plasma, and
   c. thereafter subjecting said surface to a plasma containing about 70 mole percent $CF_4$ to substantially remove silicon containing molecules from said surface,
   whereby adhesion between said organic surface and the deposited metal is improved.

14. In a method for coating an organic surface with a metal comprising depositing a metal onto the organic surface, the improvement comprising, prior to metal deposition,
   a. treating said organic surface with a hexamethyl disilane liquid, and
   b. subjecting the treated surface to a plasma containing oxygen and about 30 mole percent $CF_4$,
   whereby adhesion between said organic surface and the deposited metal is improved.

* * * * *